United States Patent
Takahashi

(10) Patent No.: US 7,291,051 B2
(45) Date of Patent: Nov. 6, 2007

(54) ORGANIC EL DEVICE AND METHOD OF FORMING THE SAME

(75) Inventor: Masaki Takahashi, Yamagata (JP)

(73) Assignee: Tohoku Pioneer Corporation, Yamagata (JP)

( * ) Notice: Subject to any disclaimer, the term of this patent is extended or adjusted under 35 U.S.C. 154(b) by 103 days.

(21) Appl. No.: 10/999,939

(22) Filed: Dec. 1, 2004

(65) Prior Publication Data
US 2005/0127829 A1 Jun. 16, 2005

(30) Foreign Application Priority Data
Dec. 11, 2003 (JP) .......................... P2003-412738

(51) Int. Cl.
*H01J 9/26* (2006.01)
(52) U.S. Cl. ..................... 445/25; 156/89.12
(58) Field of Classification Search .................. 445/25; 427/58; 156/89.11, 89.12
See application file for complete search history.

(56) References Cited
U.S. PATENT DOCUMENTS 5,962,962 A * 10/1999 Fujita et al. ................ 313/412
6,111,357 A * 8/2000 Fleming et al. ............. 313/509
6,611,098 B2 * 8/2003 Mori et al. .................. 313/512
2002/0045397 A1 * 4/2002 Tanaka ........................ 445/24
2004/0217702 A1 * 11/2004 Garner et al. ............... 313/512

FOREIGN PATENT DOCUMENTS

JP 10-312883 A 11/1998
JP 11-97169 A 4/1999

* cited by examiner

*Primary Examiner*—Ashok Patel
(74) *Attorney, Agent, or Firm*—Sughrue Mion, PLLC

(57) ABSTRACT

An organic EL device includes a substrate, at least an organic EL device layer formed above the substrate, a barrier film which covers and seals the organic EL device layer. The organic EL device layer includes a lower electrode, an upper electrode, at least an organic material layer between the lower and upper electrodes. The barrier film comprises a glass film.

3 Claims, 1 Drawing Sheet

ORGANIC EL DEVICE AND METHOD OF FORMING THE SAME

BACKGROUND OF THE INVENTION

1. Field of the invention

The present invention relates to an organic EL device, and a method for forming it.

2. Description of the Related Art

An organic EL (Electroluminescence) device is a luminescence device having a stacked structure in which a lower electrode is formed above a substrate, an organic material layer including a luminescent layer is formed in a single- or multi-layer form above the lower electrode, and an upper electrode is formed on the organic material layer, whereby the organic material layer is interposed between the pair of electrodes. One of the upper and lower electrodes is used as an anode, and the other electrode as a cathode. When a voltage is applied between the electrodes, electrons which are injected and transported from the cathode into the organic material layer recombine with holes which are injected and transported from the anode, thereby causing luminescence. Recently, such an organic EL device receives attention as a thin luminescence device which can provide surface luminescence, and which constitutes a light source for various purposes or a display unit of a self-luminous thin display device.

In such an organic EL device, it is known that, when the stacked member (organic EL device layer) configured by the organic material layer and the electrodes is exposed to the outside air, luminescence characteristics are impaired. In order to enhance the stability and durability of luminescence, therefore, a sealing for blocking the organic EL device layer from the outside air is indispensable. Usually, such sealing means is realized by bonding a passivation film onto a substrate on which an organic EL device layer is formed, so as to cover the layer, and placing the organic EL device layer in a sealing space which is formed between the substrate and the passivation film.

By contrast, in order to cope with the increased kinds of display panel forms due to further thinning, employment of a flexible substrate, and the like, various sealing techniques have been proposed (see Patent References JP-A-10-312883, JP-A-11-97169).

JP-A-10-312883 discloses a technique in which a passivation film covering an organic EL device layer is configured by two layers of a buffer film covering a defect portion, and a barrier film formed by a thin film which is stacked on the film. JP-A-11-97169 discloses a technique in which a glass modifying material composed of an element such as Sc or Ce, or an oxide or sulfide of such an element is doped into a glass forming material (host) composed of an oxide or sulfide of an element such as Si or Zn, and the resulting material is subjected to sputtering at a low temperature, or a vapor deposition method such as ion beam or ion plating, thereby forming a protective layer covering an organic EL device layer.

In these conventional techniques, the barrier film or the protective layer is grown by sputtering or vapor deposition. Therefore, such a film or layer can be usually grown only at a rate as low as about several nm/sec. Consequently, the film growth process requires a long time period, and a film having a sufficient gas barrier property cannot be formed in view of the reduction of the required time period. In the conventional techniques, moreover, a large residual stress is applied to the barrier film, and hence cracks easily occurs, with the result that the thickness of the film cannot be largely increased. As a countermeasure against this disadvantage, the buffer film is interposed to relax the stress. In the configuration where only the buffer film is used, however, film growth which is sufficient for relaxing a residual stress cannot be conducted.

In the conventional art, a film is grown by a method in which a film material is caused to scatter in a film growth chamber. Therefore, such a film growth method has disadvantages that the utilization efficiency of the material is poor. To ensure a larger thickness is in the film growth, the material is used more wastefully.

SUMMARY OF THE INVENTION

The invention has been made in view of the above circumstances. An object of the invention is such as that the time period required for growing a barrier film which seals an organic EL device is shortened, that a residual stress acting on the barrier film can be reduced and the thickness of the barrier film is increased to enhance the gas barrier property, and that a material of the barrier film is enabled to be effectively used.

According to a first aspect of the invention, an organic EL device comprises a substrate; an organic EL device layer formed on the substrate; and a barrier film which covers and seals the organic EL device layer, in which the organic EL device layer includes a lower electrode; an upper electrode; and an organic material layer between the lower and upper electrodes, and the barrier film comprises a glass film.

According to a second aspect of the invention, a method of forming an organic EL device, comprising: forming an organic EL device layer above a substrate; and forming a barrier film which seals the organic EL layer, in which the forming the barrier film comprises applying a glass film to cover the organic EL device layer, and the organic EL device layer includes: a lower electrode; an upper electrode; and an organic material layer between the lower and upper electrodes.

DETAILED DESCRIPTION OF THE PREFFERED

Figure 1A:
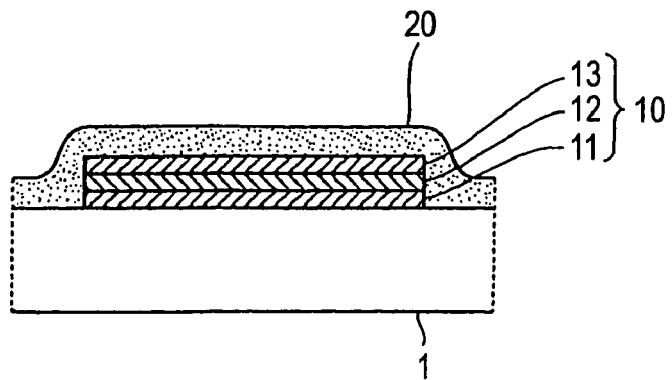
FIGS. 1A and 1B are diagrams illustrating organic EL devices of embodiments of the invention.
Figure 1B:
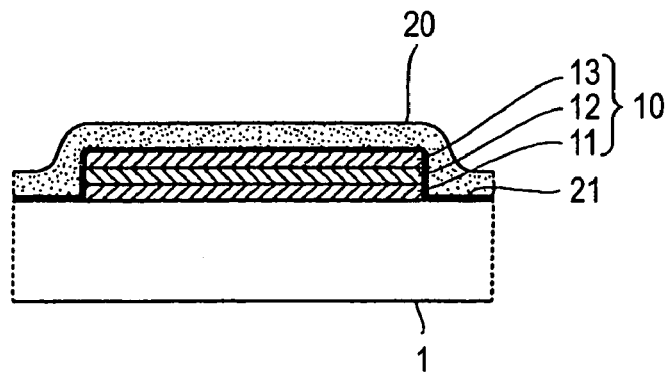

Hereinafter, embodiments of the invention will be described with reference to the accompanying drawings. FIG. 1A is a diagram showing an organic EL device of a first embodiment of the invention, and FIG. 1B is a diagram showing an organic EL device of a second embodiment.

In the organic EL device of the embodiment shown in FIG. 1A, an organic EL device layer 10 is formed above a substrate 1, and a barrier film 20 which seals the organic EL device layer 10 is formed. In the organic EL device of the embodiment shown in FIG. 1B, an organic EL device layer 10 is formed above a substrate 1, a buffer film 21 is formed above the organic EL device layer 10, and a barrier film 20 is formed so as to cover the buffer film.

The organic EL device layer 10 has a stacked structure comprises a lower electrode 11, an organic material layer 12 including a luminescent layer, and an upper electrode 13, and the organic material layer 12 is interposed between the pair of electrodes.

The barrier film 20 is a glass film which is formed by application so as to cover the organic EL device layer 10. The buffer film 21 has at least a heat insulating function, and functions so as to reduce the irregularity above the organic EL device, thereby improving the growth state of the barrier film 20 which is to be later formed, and enhancing the adhesive property of the barrier film 20.

In the thus configured organic EL devices, the barrier film 20 is formed by an application method in place of a thin film forming technique such as sputtering or vapor deposition, and hence the barrier film 20 which has a sufficient gas barrier function can be immediately formed. In other words, the barrier film 20 having a sufficient thickness can be formed without lowering the working efficiency of the film formation. Even when the barrier film 20 is formed so as to have a single-layer structure, it is possible to attain a sufficient gas barrier property.

Since the barrier film 20 is a glass film, the airtightness which is higher than that in the case of a resin or the like can be ensured for a long term. Therefore, the organic EL device layer 10 can be completely isolated from ambient oxygen and moisture. As a result, it is possible to surely suppress deterioration of luminescence characteristics, and occurrence of a dark spot.

In the case where the buffer film 21 is interposed between the organic EL device layer 10 and the barrier film 20, the heat insulating function of the buffer film 21 can prevent the organic EL device layer 10 from a thermal influence during the formation of the barrier film 20, so that deterioration or damage can be prevented from occurring in the organic EL device layer 10 during the production process.

Figure 2:
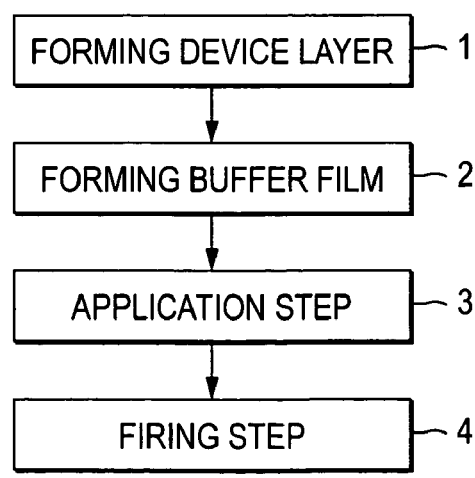
FIG. 2 is a flowchart illustrating a method of forming the organic EL devices of the embodiments of the invention.

A method for forming thus configured organic EL devices of the embodiments will be described with reference to the flowchart of FIG. 2. First, the organic EL device layer 10 is formed above the substrate 1 (S1). When needed, the buffer film 21 is formed above the organic EL device layer 10. Next, while heating the substrate 1 at 40 to 100° C., a glass film is applied so as to cover the organic EL device layer 10 (application step: S3). Thereafter, the applied glass film is fired in a low-moisture state (100 ppm or lower) or a vacuum state (firing step: S4). As a result, the barrier film 20 configured by a glass film of a predetermined thickness can be formed.

According to the forming method, in the formation of the barrier film 20, a material is applied by an application method, and a glass film is then formed by low temperature heating. Therefore, a barrier film having a thickness which is required for the gas barrier property can be immediately formed without exerting an adverse thermal influence particularly above the organic EL device layer. Consequently, it is not necessary to grow the barrier film 20 by stacking of multiple layers, and hence multiple film growth chambers for forming a multi-layer film are not required, thereby a production line can be shortened.

In the application method, since a material is applied only to a place where application is required, the material is not scattered in a film growth chamber, and the utilization efficiency of the material can be enhanced. As a result, the production cost can be lowered as compared with the conventional method.

Hereinafter, the components of the organic EL devices and steps of forming the devices will be described more specifically.

a. Substrate

As the form of the substrate 1, any form such as a planar form, a flexible film-like form, or a spherical form can be employed. The substrate 1 may be made of glass, plastics, quarts, a metal, or another material. In the case where light is emitted from the substrate side (bottom emission), the substrate 1 is made of a transparent or translucent material.

b. Electrodes

Either of the lower electrode 11 or the upper electrode 13 can be set as a cathode or an anode. The anode is made of a material of a work function which is higher than that of the cathode. As the anode, useful are a metal film of chromium (Cr), molybdenum (Mo), nickel (Ni), platinum (Pt), or the like, and a transparent conductive film such as a metal oxide film of ITO, IZO, or the like. By contrast, the cathode is made of a material of a work function which is lower than that of the anode. As the cathode, useful are a metal film of aluminum (Al), magnesium (Mg), or the like, an amorphous semiconductor such as doped polyaniline, or doped polyphenylene-vinylene, and an oxide such as $Cr_2O_3$, NiO, or $Mn_2O_5$. In the case where both the lower electrode 11 and the upper electrode 13 are made of a transparent material, a configuration is employed in which a reflection film is disposed above the electrode side opposite to the light emission side.

An example of the passive matrix electrode structure will be shown. ITO or the like is grown on the substrate by vapor deposition, sputtering, or another method, and the lower electrode 11 which is patterned into plural stripes is formed by a pattern forming method such as photolithography. The upper electrode 13 is formed into plural stripes which are opposed to the lower electrode 11 across the organic material layer described later, and which elongate in a direction perpendicular to the lower electrode. As a result, organic EL devices are formed respectively at intersections of the lower electrode 11 and the upper electrode 13, so as to be arranged in a dot matrix.

c. Insulating Layer, Barrier Wall

Although not shown in FIG. 1, an insulating film made of an insulating material such as polyimide, SiN, or $SiO_2$ is formed so as to partition luminescence areas of the lower electrode 11. Specifically, the insulating film is formed above the lower electrode 11 by the spin coating method so as to have a predetermined application thickness, and then shaped into a predetermined pattern by an exposing process using an exposure mask, and a developing process. With respect to the above-mentioned stripe lower electrode 11, the insulating film is stacked or formed so as to partly cover the substrate surface between the stripes of the lower electrode 11, and also the ends of the lower electrode 11 along the stripe line, and in stripes which are perpendicular to the lower electrode 11, and arranged at predetermined intervals. According to the configuration, opening portions of the insulating film define the luminescence areas of the organic EL device.

Next, a barrier wall is formed above the insulating film with the objects such as those of electrically insulating adjacent lines of the upper electrode 13 from each other, and using the barrier wall as a shadow mask. Preferably, the barrier wall has a reversed taper shape. However, the shape of the barrier wall is not particularly restricted as far as the above-mentioned objectives can be achieved. In the case where the upper electrode 13 is formed by conducting a patterning with using a shadow mask or the like, and then vapor deposition, the barrier wall may not be disposed.

A method for forming the barrier wall will be described. An insulating material such as a photosensitive resin is applied to the insulating film by the spin coat method or the like so as to have a thickness which is larger than the sum of the thicknesses of the organic material layer 12 and the upper electrode 13. The photosensitive resin film is irradiated with UV rays or the like via a photo mask having a predetermined opening pattern. The reversedly tapered barrier wall is formed with using the difference in development rate due to variation in exposure value in the layer thickness direction.

d. Organic Material Layer

The organic material layer 12 has a single- or multi-layer structure including a luminescent layer and made of an organic compound. The organic material layer is formed by: a wet process including an application method such as the spin coating method, or the dipping method, or a printing method such as the ink jet method or the screen printing method; or a dry process such as the vapor deposition method, or the laser Induced Thermal Imaging (Liti).

The layer configuration may be formed in any manner. Usually, a layer configuration can be used in which a hole transporting layer, a luminescent layer, and an electron transporting layer are stacked in this sequence as advancing from the anode toward the cathode. Alternatively, plural luminescent layers, hole transporting layers, or electron transporting layers may be stacked in place of a single-layer stack. One or both of the hole transporting layer and the electron transporting layer may be omitted. Organic material layers such as a hole injecting layer and an electron injecting layer may be inserted in accordance with the usage of the device. In the hole transporting layer, the luminescent layer, and the electron transporting layer, conventional useful materials (whether a polymer material or a low-molecular material) can be adequately selected and used in accordance with the luminous color.

As the luminescent material forming the luminescent layer, either of a material which exhibits luminescence (fluorescence) when the state is returned from the singlet excited state to the ground state, and that which exhibits luminescence (phosphorescence) when the state is returned from the triplet excited state to the ground state can be used.

e. Buffer Film

The buffer film 21 is made of: an organic material such as a photo-curing resin, a material having a glass transition point, a thermoplastic resin, or another polymer material, or various low-molecular materials; an oxide such as $SiO_2$, SiO, GeO, or $Al_2O_3$; a nitride such as TiN; or a metal such as Au or Pt, and formed by a film growth method such as CVD, sputtering, or ion plating. The disposition of the buffer film 21 can buffer a damage which may be caused during the heating step for producing the barrier film 20, and prevent the organic EL device layer 10 from being damaged by generation of a gas. The film formation is conducted with setting a thickness of 100 to 300 nm as a target.

f. Barrier Film

In order to seal the organic EL device layer 10, a glass film serving as the barrier film 20 is applied onto the buffer film 21 by the low temperature glass coating technique. Specifically, a reaction product which hydrolyzes, and dehydrates and condenses an organic metal compound in the presence of borate ions with using halogen ions as a catalyst is formed in a reaction solution composed of water and an organic solvent. The reaction product is applied onto the buffer film 21, or onto the organic EL device layer 10, and then heated and fired at 70 to 150° C., thereby forming the barrier film 20 at a thickness of 10 to 100 μm. In the above description, application means a film growth conducted by: a printing method such as relief, intaglio, planographic, stencil, ink jet, or bubble jet (registered trademark); or another method such as spin coater, spinless coater, dispense, or dip coating.

g. Various Methods, etc.

The organic EL devices of the embodiments of the invention may be used for forming a display panel of the passive matrix type, or forming a display panel of the active matrix type. In order to form the organic EL panel as a color display panel, useful are the selective application method in which luminescent function layers are selectively colored, a method (the CF method or the CCM method) in which monochromatic luminescent function layers of white, blue, or the like are combined with a color converting layer formed by a color filter or a florescent material, a method (photobleaching method) in which, for example, luminescence areas of monochromatic luminescent function layers are irradiated with electromagnetic waves to realize multi-color luminescence, or other methods. According to the configuration, a full-color organic EL panel or a multi-color organic EL panel can be realized.

The organic material layer 12 which is interposed between the pair of electrodes 11, 13 above the substrate 1 may be configured so as to be stacked in plural layers, in place of the above-mentioned signal layer structure, so as to exhibit multi-color luminescence. For example, it is possible to employ a structure of a substrate/a lower electrode/a first organic material layer/a first intermediate electrode/a second organic material layer/a second intermediate electrode/a third organic material layer/ . . . /an upper electrode.

The organic EL devices of the embodiments of the invention may be formed as the bottom emission type in which light is emitted from the side of the substrate 1, or the top emission type in which light is emitted from the side opposite to the substrate 1. In this case, the buffer film 21 and the barrier film 20 are made of a transparent or translucent material.

EXAMPLE

Step of Forming Organic EL Device Layer

As the lower electrode (anode), ITO is grown above the glass substrate at a thickness of 150 nm by sputtering, and a photoresist (photoresist AZ6112 produced by Tokyo Ohka Kogyo Co., Ltd.) is patterned as a stripe above the ITO film. Next, the glass substrate is immersed in a mixture solution of an aqueous solution of ferric chloride and hydrochloric acid, to etch away ITO which is not covered by the photoresist. Thereafter, the substrate is immersed in aceton to remove the photoresist, thereby forming the substrate above which a predetermined ITO pattern is formed.

Thereafter, the glass substrate having the ITO pattern is loaded into a vacuum deposition apparatus, and CuPc of a thickness of 30 nm is first grown as a hole transporting layer. Next, α-NPD of a thickness of 50 nm is grown as a hole injecting layer. With using a shadow mask, spiro-DPVBi of a thickness of 30 nm is grown as a blue luminescent layer, a film growth material composed of a host material: CPB and a dopant: $Ir(ppy)_3$ is grown at a thickness of 30 nm as a green luminescent layer, and a film growth material composed of a host material: CPB and a dopant: $Btp_2Ir$ (acac) is grown at a thickness of 30 nm as a red luminescent layer. Thereafter, $Alq_3$ of a thickness of 20 nm is grown as an electron transporting layer, and LiF of a thickness of 1 nm is grown as an electron injecting layer. As the upper electrode (cathode), finally, Al is grown at a thickness of 100 nm.

Step of Forming Buffer Film

Then, $SiO_2$ is vapor-deposited at 100 nm as the buffer film by sputtering.

Step of Forming Barrier Film

A reaction product is produced with using: organopolysiloxane as an organic metal compound, ammonium fluoride oxide as a halogen catalyst; methanol, ethanol, and isopropanol as a mixed solvent. The substrate is preliminarily dried at 50 to 70° C., and the reaction product is then applied to the substrate. The resulting product is fired at 120° C. for 30 minutes, so that a glass film of 10 μm is formed as the barrier film.

According to the organic EL devices and the method of producing the devices according of the embodiments or the example, the time period required for growing a barrier film which seals the organic EL device can be shortened, the thickness of the barrier film can be increased to enhance the gas barrier property, and a material of the barrier film can be effectively used, so that the production cost can be reduced.

What is claimed is:

1. A method of forming an organic EL device, comprising:
    forming at least an organic EL device layer above a substrate;
    forming a barrier film which seals the organic EL layer,
    wherein the forming the barrier film comprises applying a glass film to cover the organic EL device layer, and the organic EL device layer includes:
        a lower electrode,
        an upper electrode, and
        at least an organic material layer between the lower and upper electrodes; and
    firing the glass film in a low-moisture state subsequently to the applying.

2. A method of forming an organic EL device, comprising:
    forming at least an organic EL device layer above a substrate;
    forming a barrier film which seals the organic EL layer,
    wherein the forming the barrier film comprises applying a glass film to cover the organic EL device layer, and the organic EL device layer includes:
        a lower electrode,
        an upper electrode, and
        at least an organic material layer between the lower and upper electrodes; and
    firing the glass film in a vacuum state subsequently to the applying.

3. A method of forming an organic EL device, comprising:
    forming at least an organic EL device layer above a substrate, wherein the organic EL device layer includes a lower electrode, an upper electrode and at least an organic material layer disposed between the lower and upper electrodes;
    forming a buffer film above the organic EL device;
    forming a barrier film above the buffer film,
    wherein the forming the barrier film comprises applying a glass film to cover the buffer film and the organic EL device layer, and
    wherein the glass film includes at least an organic metal compound and a halogen catalyst; and
    firing the glass film above the substrate in a low-moisture state or in a vacuum state.

* * * * *